(12) United States Patent
Wigren

(10) Patent No.: US 9,114,535 B2
(45) Date of Patent: Aug. 25, 2015

(54) OBJECT-SENSING VALVE FOR A VACUUM GRIPPER

(71) Applicant: Xerex AB, Taby (SE)

(72) Inventor: Gustaf Wigren, Vaxholm (SE)

(73) Assignee: XEREX AB, Taby (SE)

( * ) Notice: Subject to any disclaimer, the term of this patent is extended or adjusted under 35 U.S.C. 154(b) by 245 days.

(21) Appl. No.: 13/833,762

(22) Filed: Mar. 15, 2013

(65) Prior Publication Data

US 2013/0248746 A1 Sep. 26, 2013

(30) Foreign Application Priority Data

Mar. 22, 2012 (SE) ...................................... 1250283

(51) Int. Cl.
*B25J 19/00* (2006.01)
*B65G 47/91* (2006.01)
*H01L 21/683* (2006.01)
*B25B 11/00* (2006.01)

(52) U.S. Cl.
CPC ............... *B25J 19/00* (2013.01); *B65G 47/917* (2013.01); *B25B 11/005* (2013.01); *H01L 21/6838* (2013.01)

(58) Field of Classification Search
CPC .... B25B 11/005; B25B 11/02; H01L 21/6838
USPC ..................... 269/21, 20, 903, 900
See application file for complete search history.

(56) References Cited

U.S. PATENT DOCUMENTS

| 3,811,667 A * | 5/1974 | Mayer ............................ 269/23 |
| 5,035,409 A | 7/1991 | Mulliner |
| 5,590,870 A * | 1/1997 | Goellner ......................... 269/21 |
| 2003/0074788 A1* | 4/2003 | Gordon ........................... 29/832 |
| 2006/0131905 A1 | 6/2006 | Mazzucchelli |
| 2009/0057971 A1* | 3/2009 | Bumgarner et al. ............. 269/21 |
| 2013/0248746 A1* | 9/2013 | Wigren ........................ 251/301 |

FOREIGN PATENT DOCUMENTS

| DE | 3923672 A1 | 5/1990 |
| EP | 1671906 A1 | 6/2006 |
| WO | 2006/048959 | 5/2006 |
| WO | 2010088925 A1 | 8/2010 |

OTHER PUBLICATIONS

Extended European Search Report, dated Jun. 17, 2013, from corresponding EP application.

* cited by examiner

*Primary Examiner* — Lee D Wilson
(74) *Attorney, Agent, or Firm* — Young & Thompson

(57) ABSTRACT

An object-sensing valve configured for integration in the suction duct (3) of a vacuum gripper includes a flexible and back-springing tongue (10), one end (11) of which is anchored by the side of the suction duct and the other end (14) of which extends freely outside a mouth (8; 8') to the suction duct, the tongue dimensioned to be forced by an air flow (F) to bend towards the mouth of the suction duct and to cover the mouth incompletely in the loaded state of the tongue.

11 Claims, 2 Drawing Sheets

OBJECT-SENSING VALVE FOR A VACUUM GRIPPER

TECHNICAL FIELD OF THE INVENTION

This invention refers to a valve which is adapted for integration in the suction duct of a vacuum gripper, the valve configured for closing of the suction duct except for a limited leak flow when the vacuum gripper does not contact an object, while opening the suction duct when the vacuum gripper is placed in contact with an object.

BACKGROUND AND PRIOR ART

Vacuum gripping means which are arranged to permit a limited leakage and in-flow of air at ambient pressure via a restriction to the flow in a suction duct are previously known. These vacuum gripping means are often used in grippers that include a plurality of suction mouths which are distributed over an area and which are supplied from a common vacuum source. The suction mouths may be arranged in rows and columns in the form of an array, e.g., or in the shape of concentric rings, or may be arranged in a singular row. A set of suction mouths are this way connected to a common vacuum chamber in the vacuum gripper which may be realized in different embodiments of plates or beams, e.g.

Vacuum gripping means of this type are suitable for handling of objects which may vary in shape and/or size, e.g., or in the simultaneous handling of several objects such as sets of objects which are to be picked up and released at regular interspaced relation. The restriction to the suction duct flow ensures that a useful work pressure is generated in the vacuum gripper also in a case where one or several suction mouths are inactive and therefore admit a leak flow of ambient pressure into the vacuum chamber.

This technical approach requires surplus capacity with the vacuum source, which typically operates at oversized effect and energy consumption in order to compensate for the loss in efficiency which is caused by the leak flow.

The restriction to flow in the suction duct may be of fixed and invariable type, and thus insensitive to the presence of an object. A drawback in this kind of solution is that evacuation of air from between the gripper and the object via a restricted flow through the suction duct will be relatively time-consuming. Another drawback in relation to a flow that is reduced by means of a fixed restriction in the suction duct is a resulting delay in the process of releasing the object from the gripper. In order to improve the dynamics of the system and to shorten work cycle times, the fixed restriction may be dimensioned to permit a larger leak flow which would obviously require a correspondingly increase in consumption of energy in the vacuum generator.

Another approach aimed to improve the dynamics of the system would be to integrate an object-sensing valve in the suction duct, a valve that on one hand is configured to allow only a limited flow of air in the suction duct when the vacuum gripper is not in contact with an object, and which on the other hand is configured to open the suction duct for unrestricted flow of air when the vacuum gripper is brought into contact with an object, or upon release of an object from the vacuum gripper, respectively.

A previously known object-sensing valve for a vacuum gripper comprises a ball which seals only incompletely against a seat when the ball is sucked towards the seat by an inwardly directed flow, and which falls out from the seat to open the suction duct when the gripper is brought into contact with an object and the flow in result thereof is reduced or ceased. A drawback in relation to this known leak flow valve is that its operation is dependent on the valve's position in space, since the ball is caused by gravitational force to fall out from the seat.

SUMMARY OF THE INVENTION

In general, the invention aims at providing a dynamic vacuum system characterized by short work cycle times and an optimized energy consumption.

The invention particularly aims at providing an object-sensing valve for a vacuum gripper, wherein the valve avoids the drawbacks discussed above in relation to prior art solutions.

The object is met in the form of an object-sensing valve that is configured for integration into the suction duct of a vacuum gripper, the valve comprising a flexible and elastic tongue one end of which is anchored by the side of the suction duct, the other end of which extends freely outside the mouth of the suction duct, wherein the tongue is dimensioned to bend towards the mouth of the suction duct from the load of an air flow that is directed towards the suction duct, the tongue in its loaded condition incompletely covering the mouth of the suction duct.

Through the inherent elasticity of the valve tongue, a biasing force is applied on the tongue which is urged thereby to assume an open position permitting unrestricted flow of air through the valve. On the other hand, the flow of air into the suction duct creates a drop in pressure on this side of the tongue, which acts to draw the tongue towards the mouth of the suction duct. Accordingly, the valve is not dependent on its orientation in space in order to function. Since in the loaded condition the tongue covers the mouth of the suction duct only incompletely, a leak flow and a pressure differential is maintained that keeps the tongue in the loaded state, until the gripper is brought in contact with an object whereupon the flow and pressure difference ceases and the tongue springs back to its original, unloaded position.

It will be realized that the functionality is partly dependent on the elasticity of the tongue, and dimensions and choice of material in the tongue are parameters which need to be considered from case to case in order to ensure the desired operation. However, since operating pressure and flow are both parameters which may vary from one vacuum system to another it is not meaningful to provide herein a detailed specification which would be valid for a chosen implementation of the invention. Commercially available qualities in material include a number of candidates which would be suitable for the purpose. It can be foreseen that a skilled person, having knowledge about mechanical properties and behavior of these materials when used in suction cups and bellows, e.g., will have the skills and facilities required to try out and to choose the material and dimensions which would ensure the function of the tongue in a particular application.

It is preferred that the leak flow is introduced via a gap which is formed as the length of a flexible portion of the tongue, when viewed in a direction towards the tongue's free end, is shorter than the extent of the mouth of the suction duct in the same direction. A leak flow may however be alternatively created via a gap that is formed in other way, such as along the side of the tongue, as the tongue covers only partly the suction duct mouth.

Furthermore, the suction duct may advantageously be arranged to open in a convexly curved or arcuate surface that provides, on each side of the mouth, a support surface for the tongue in its loaded state. This way, the tongue will undergo a gradual and controlled deformation in to and out from the loaded state, and the embodiment reduces the risk for fracture in the tongue due to fatigue.

The embodiment which includes a supporting surface curved outwardly from the suction duct also permits increasing the length of the tongue, and increasing the dimensions of the supporting surface and the mouth of the suctions duct as well, as viewed in a plane that shows the actual length of the tongue. This may be advantageous if the invention is implemented in vacuum grippers of smaller sizes, e.g. The tongue may be arranged by the side of the suction duct to extend in a direction at which the free end of the tongue reaches into an imaginary extension of the suction duct outwardly of the suction duct mouth, as viewed in the aforementioned plane.

In one advantageous embodiment of the invention, the mouth of the suction duct is realized in the form of one or more slots which have a reducing width, transversely to the flow direction, from that end of the mouth which is adjacent to a point of attachment of the tongue by the side of the suction duct and towards the opposite end where the gap for the leak flow is created in the incompletely covering state of the tongue. The embodiment results in a leak flow which gradually reduces in relation to a gradually increasing pressure drop over the valve, via a suction duct mouth which provides a flow area that is reducing gradually in the length direction of the tongue. An effect hereof, resulting from the gradually reducing flow area in the length direction of the tongue, is that the ability of the valve to react upon the presence of an object is improved since the tongue's sensitivity and spring back motion in response to a decrease in the pressure drop over the valve is increased, proportionally to the degree of bending deformation of the tongue.

It is further of advantage when the tongue is formed with reinforcements that provide increased resistance against bending and added rigidity to the tongue transversely to the desired bending direction upon loading/bending of the tongue. These enforcements may in alternative embodiments include elements of more rigid material that is integrated in the tongue, or may include stiffening ridges formed in one side of the tongue, e.g.

The object-sensing valve can be configured for integration into a vacuum gripper's suction duct as a unit, including the suction mouth and the associated tongue. This unit can be mounted into the suction duct where the suction duct opens in the vacuum gripper, or be inserted in the suction duct, or integrated in the suction duct as a part thereof.

Further advantageous and details of the invention will appear from the following detailed description.

SHORT DESCRIPTION OF THE DRAWINGS

Embodiments of the invention will be explained more closely below with reference made to the accompanying schematic drawings, wherein FIG. 1 shows a partially broken away sectional view through a vacuum gripper with a suction cup and an object-sensing valve according to the present invention integrated in a suction duct through the vacuum gripper;

DETAILED DESCRIPTION OF PREFERRED EMBODIMENTS

Figure 1:
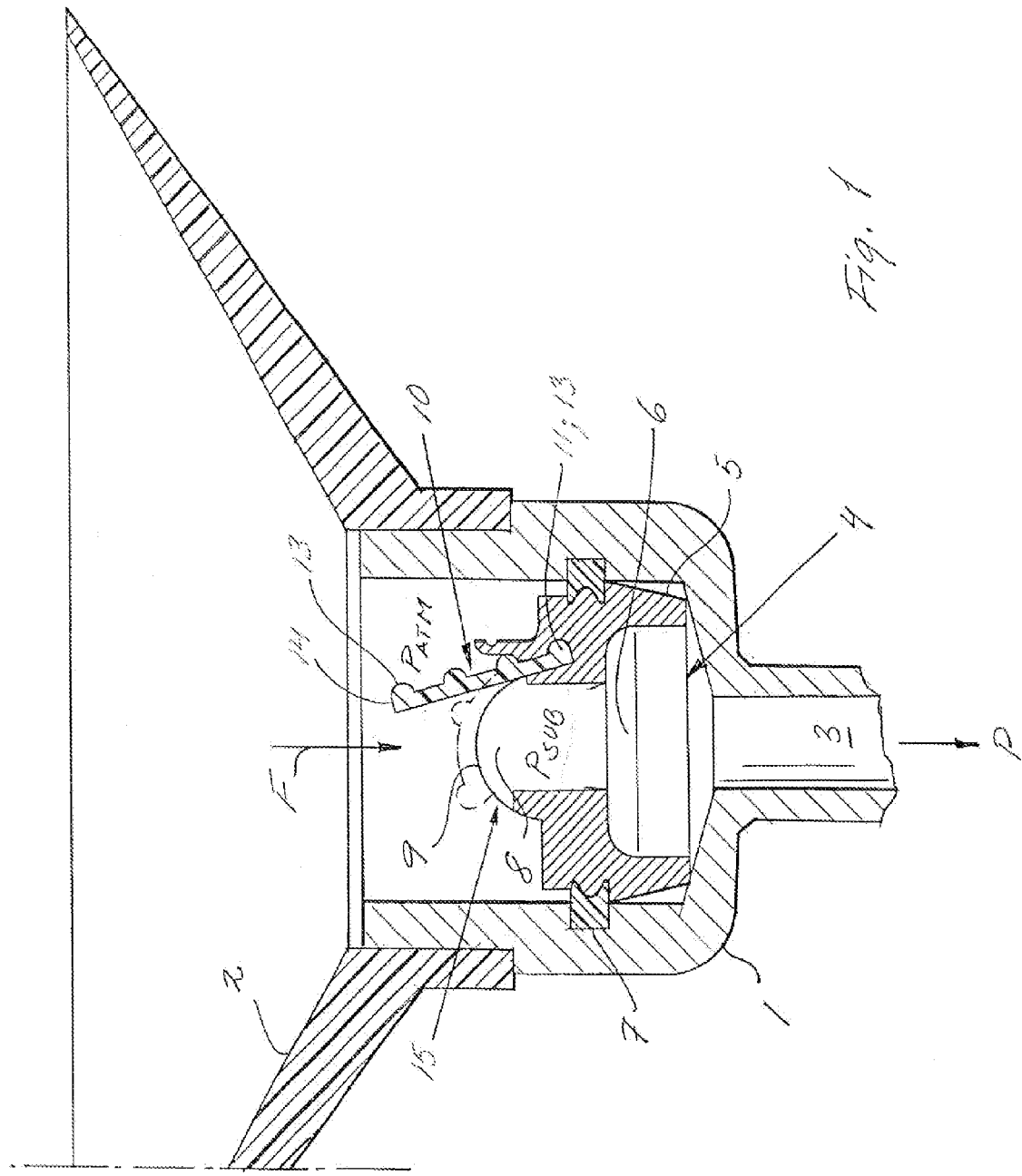
Figure 2:
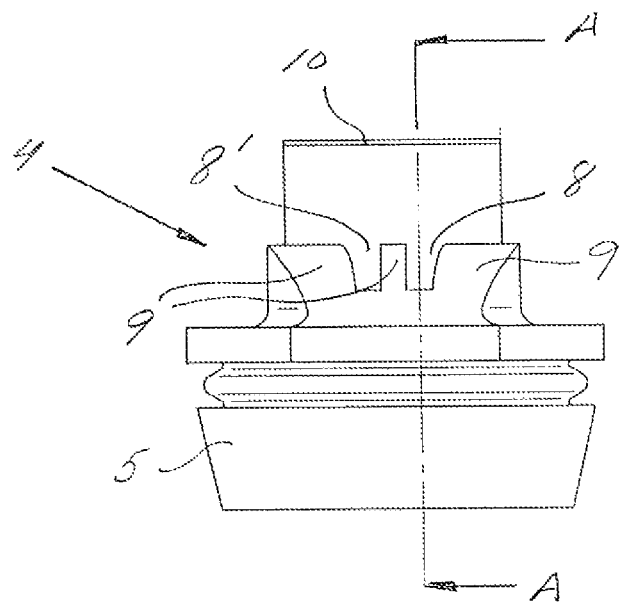
FIG. 2 shows a side view of the valve of FIG. 1.

For illustrating purposes, FIG. 1 shows a vacuum gripper means here comprising a holder 1 for a suction cup 2. Vacuum is supplied to the suction cup via a suction duct 3 which opens in the holder. The suction duct is in flow communication with a vacuum source P, not further illustrated in the drawing. An object-sensing valve 4 in accordance with the present invention is arranged in the holder 1.

The valve 4 comprises a body 5 having a through passage 6. The valve body 5 is accommodated in the holder 1 in such way that the passage 6 through the valve body forms an extension of the suction duct 3, whereas air flow from the valve body and the holder is prevented in result of a tight fit between the valve body and the holder, or alternatively by means of a sealing element 7 inserted as illustrated schematically in FIG. 1.

In its mounted position, the valve 4 with the through passage 6 can be seen as a unit that is integrated in the suction duct 3. The suction duct is this way provided a mouth 8 in the outer face of the valve body 5. In the illustrated embodiment the suction duct mouth 8 is defined between outwardly curved or arcuate surfaces 9 in the end of the valve body, the surfaces 9 forming supporting faces for a tongue 10 which is anchored by the side of the suction duct. Since the suction duct opens in a convex surface that is curved outwardly as illustrated, the length of the tongue and the length of the suction duct mouth and of the supporting surfaces as well, can be extended as viewed in the sectional plane A-A, i.e. within the subject diameter of the suction duct. In its unloaded state, the tongue 10 may be arranged to extend in a direction at which the free end of the tongue reaches inside of an imaginary extension of the suction duct, outwardly of the mouth 8.

As already mentioned, the tongue 10 is made of an elastic material which in a deformed and bended condition strives to return to its original shape. The tongue 10, which may have four-sided, rectangular shape, is anchored in the valve body 5 by the side of the suction duct through the valve body. In the illustrated embodiment, an end region 11 of the tongue is inserted laterally into a seat 12 that is formed in the valve body (see FIG. 3, wherein end portions of the seat 12 are visible outside the tongue 10 which is indicated by dash-dot lines). The tongue 10 may be secured in the seat 12 in any suitable way. In the illustrated embodiment, the tongue is secured in a seat having a sectional profile that is adapted to a ridge or rib 13, running along a transverse edge of the tongue. Several ridges 13 may be distributed over the same side of the tongue, running in parallel in the width direction of the tongue to form reinforcements that provide increased resistance to bending of the tongue in other directions than the desired closing direction.

In the unloaded state of the tongue, the free end 14 of the tongue extends outside the mouth 8 of the suction duct. Upon connecting the vacuum gripper to a vacuum source P, an air stream F into the suction duct will generate a drop in pressure $P_{SUB}/P_{ATM}$ over the tongue, forcing the tongue to bend into the air stream. When a certain sub-pressure level is reachee in the suction duct, the full length of the tongue will be sucked towards the suction duct mouth. Restriction of the air flow to the suction duct is this way accomplished gradually in proportion to an increase of the differential pressure over the tongue.

In the fully bended state of the tongue, the tongue is supported against the curved supporting surfaces 9 in a way illustrated through dashed lines in FIG. 1. In this state, the tongue covers the mouth of the suction duct with exception for a gap 15 that is formed in result of the tongue having a length, in the sectional plane A-A, which is less than the length of the mouth of the suction duct in the same plane.

A constant and controllable flow is this way established via the gap 15 at the vacuum level which is required to fully bend the tongue 10 in its bendable total length. The amount of leak flow in a valve of a given gap area can be controlled by proper choice of elasticity in the tongue 10: a more rigid tongue will result in higher flow at a given vacuum level since it will increase the force that is required to "close" the valve.

Figure 3:
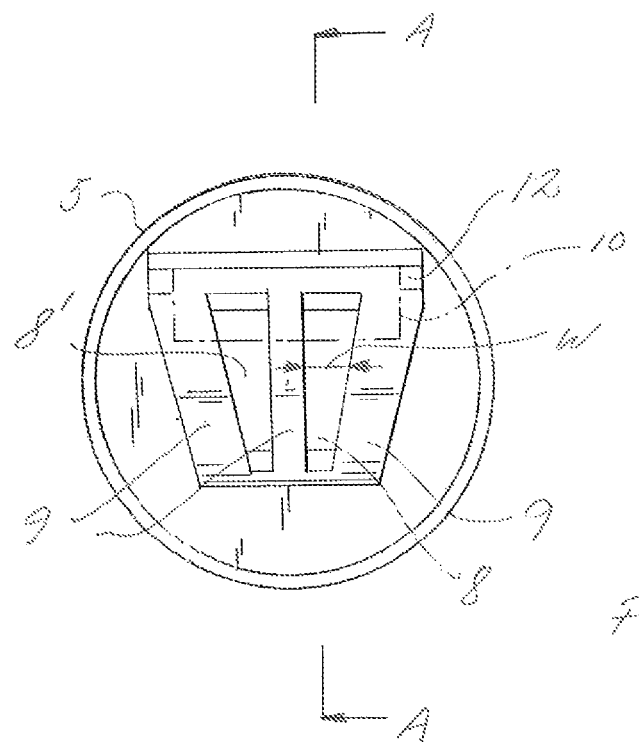
FIG. 3 shows the same valve in a view from above.

In a particularly preferred embodiment of the valve 4, see FIG. 3, the sensitivity and ability to react upon the presence of an object can be improved if the mouth of the suction duct is realized in the form of one or several slots 8, 8', having a width w transversally to the flow direction F which is successively reducing from that end of the mouth which is adjacent to the tongue's point of attachment 12 by the side of the suction duct, towards the opposite end in which the leak flow gap is formed in the incompletely covering state of the tongue.

The valve 4 can this way be adapted to different flows and vacuum levels without changing the physical dimensions of the valve. Nevertheless, no conclusions should be made from the accompanying drawings with regard to installation dimensions, the drawings being merely schematic representations of embodiment examples of the invention. In particular, in some applications the valve 4 may be dimensioned to permit installation into the suction duct of a vacuum gripper, instead of being mounted in a holder for a suction cup as illustrated in FIG. 1. Nevertheless, the valve can be seen as an integrated unit since in both cases the valve provides a mouth to the suction duct.

The invention claimed is:

1. An object-sensing valve configured for integration in a suction duct of a vacuum gripper, the valve comprising:
    a flexible and back-springing tongue one end of which is anchored by a side of the suction duct and an other end of which extends freely outside a mouth to the suction duct, the tongue dimensioned to be forced by an air flow to bend towards the mouth of the suction duct and to cover the mouth incompletely in the loaded state of the tongue, wherein
    the suction duct opens in a convexly curved or arcuate surface providing supporting faces for the tongue in the tongue's bended state, on each opposite side of the suction duct mouth, and
    a flexible part of the tongue, as viewed in a direction towards the tongue's free end and in a sectional plane which shows an actual length of the tongue, has a length which is less than an extension of the mouth of the suction duct in a same plane.

2. The valve according to claim 1, wherein the mouth of the suction duct has a width transversally to the flow direction which is gradually reducing from the end of the mouth which is adjacent to a point of attachment of the tongue by the side of the suction duct.

3. The valve according to claim 1, wherein the tongue, in an unloaded state, extends with the other end into an imaginary extension of the suction duct outside of the mouth, in the plane.

4. The valve according to claim 1, wherein the tongue is made of elastic material and includes reinforcements which add resistance against bending of the tongue in a direction transversally to a desired bending direction.

5. The valve of claim 1, characterized in that the valve is designed for mounting in the suction duct of a vacuum gripper as a unit including the suction duct mouth and the associated tongue.

6. The valve according to claim 2, wherein the tongue, in the unloaded state, extends with the other end into an imaginary extension of the suction duct outside of the mouth, in the plane.

7. The valve according to claim 2, wherein the tongue is made of elastic material and includes reinforcements which add resistance against bending of the tongue in a direction transversally to a desired bending direction.

8. The valve of claim 2, wherein the valve is designed for mounting in the suction duct of a vacuum gripper as a unit including the suction duct mouth and the associated tongue.

9. The valve according to claim 3, wherein the tongue is made of elastic material and includes reinforcements which add resistance against bending of the tongue in a direction transversally to a desired bending direction.

10. The valve of claim 3 wherein the valve is designed for mounting in the suction duct of a vacuum gripper as a unit including the suction duct mouth and the associated tongue.

11. The valve of claim 4, wherein the valve is designed for mounting in the suction duct of a vacuum gripper as a unit including the suction duct mouth and the associated tongue.

* * * * *